United States Patent [19]
Jones

[11] Patent Number: 5,907,261
[45] Date of Patent: May 25, 1999

[54] METHOD AND APPARATUS FOR CONTROLLING SIGNAL AMPLITUDE LEVEL

[75] Inventor: Mark A. Jones, Forest, Va.

[73] Assignee: Ericsson Inc., Research Triangle Park, N.C.

[21] Appl. No.: 08/924,649

[22] Filed: Sep. 5, 1997

[51] Int. Cl.$^6$ ..................................... H03G 3/30
[52] U.S. Cl. .......................................... 330/254; 330/279
[58] Field of Search ................................... 330/129, 140, 330/254, 279

[56] References Cited

U.S. PATENT DOCUMENTS

| | | | |
|---|---|---|---|
| 3,944,945 | 3/1976 | Corte et al. | 330/279 X |
| 4,250,471 | 2/1981 | Duncan . | |
| 4,322,811 | 3/1982 | Voorman | 330/278 X |
| 4,667,163 | 5/1987 | Gay | 330/279 X |
| 5,546,050 | 8/1996 | Bonebright et al. . | |
| 5,642,075 | 6/1997 | Bell . | |

OTHER PUBLICATIONS

*International Symposium on Circuits and Systems (ISCAS)*, Linear Circuits and Systems (LCD), Analog Signal Processing (ASP), London, May 30–Jun. 2, 1994, vol. 5, May 30, 1994, pp. 661–664, XP000592923, Institute of Electrical and Electronics Engineers, K. Halonen et al., "Integrated Bicmos IF–Modules for Mobile Telecommunications Applications".

*Primary Examiner*—James B. Mullins
*Attorney, Agent, or Firm*—Nixon & Vanderhye P.C.

[57] ABSTRACT

An amplitude leveling circuit includes a variable gain, linear amplifier which receives an input signal and generates an output signal corresponding to the input signal. The signals may be in differential format. A signal processor receives the output signal and determines a corresponding mean squared signal. The signal processor includes a multiplier which squares the output signal, and an averager that averages the squared signal to generate the mean squared signal. An analyzer compares the mean squared signal with a reference and generates a feedback control signal that controls the gain of the variable gain amplifier in accordance with the difference between the mean squared signal and the reference value. The gain of the variable gain amplifier is controlled so that the amplitude of the output signal is maintained at a desired amplitude level without distorting the originally input waveform shape.

7 Claims, 3 Drawing Sheets

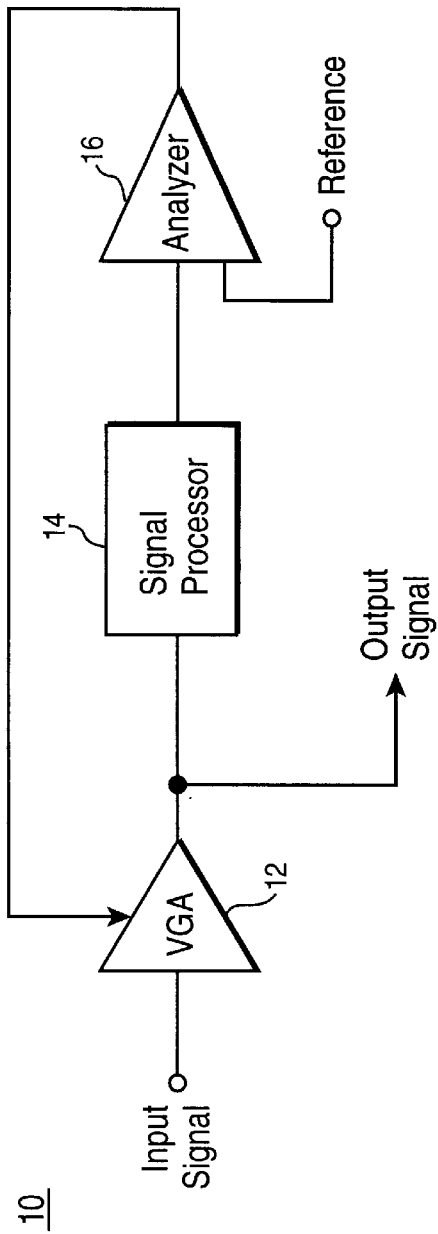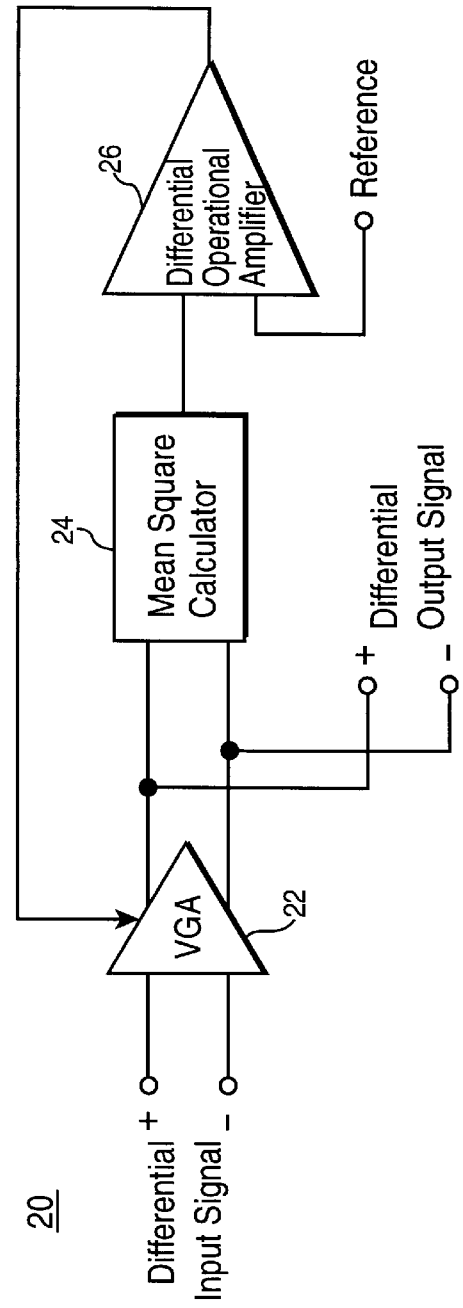

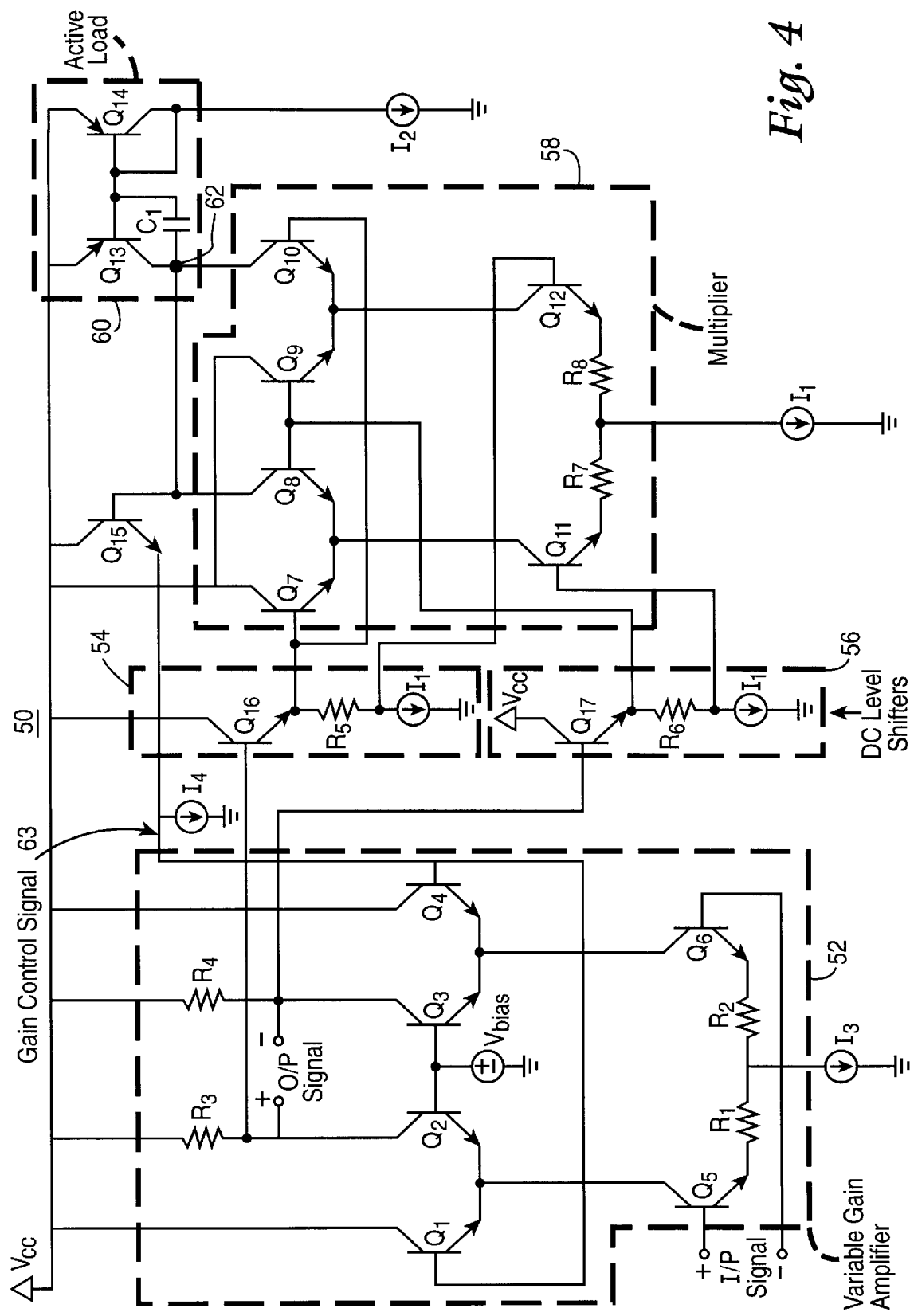

METHOD AND APPARATUS FOR CONTROLLING SIGNAL AMPLITUDE LEVEL

FIELD OF THE INVENTION

The present invention relates to amplitude leveling to ensure signal's amplitude maintains a constant level.

BACKGROUND OF THE INVENTION

In many signal processing applications, such as radio transceivers, it is necessary to convert a signal with an unknown amplitude into a signal which has an amplitude at a desired level. This amplitude control or "leveling," as it is sometimes referred to hereafter, is performed for a variety of reasons including for example:

- to provide a constant drive level for frequency mixers for phase comparators
- to ensure that an amplifier input is not overdriven
- to remove unwanted amplitude noise from a signal.

Traditionally, amplitude leveling is performed using two different types of circuits: limiters and automatic gain control (AGC) amplifiers with peak detection. As will be explained below, each of these circuits suffers drawbacks.

Limiters provide a large signal gain and produce a constant output level by "clipping," i.e., limiting, the signal peaks of input signals. Consequently, if a sinusoidal type waveform is received at the input of the limiter, the limiting amplifier produces a square wave output "clipping off" the positive and negative peaks of the sinusoid. Limiter circuits are often employed in the back end of an FM receiver to remove AM information from the received signal.

A significant drawback of limiters is their non-linearity. In the sinusoidal input example, the amplitude is effectively limited to a desired value but at great cost. The input sinusoidal waveform is distorted, and the output is more like a square wave than a sinusoid. Accordingly, limiter circuits are not appropriate in applications where the linearity and waveform shape of the input signal must be preserved at the output. Examples of such applications include a receiver chain prior to out-of-band filtering, and a linear transmitter where harmonic levels must be controlled, or any signal processing performed on signals with amplitude modulation.

The other category of traditional amplitude levelers is AGC amplifiers with peak detection. AGC amplifiers use feedback in an attempt to maintain signal wave shape as amplitude level is controlled. However, AGC amplifiers with peak detection detect either the negative or the positive peak of the signal rather than detecting the peak-to-peak level or the RMS level of the input signal. As a result, AGC levelers are not accurate for non-symmetrical signals.

There are other drawbacks with an AGC approach. AGC amplifiers with peak detection also do not operate on differential signals. This is a substantial problem for integrated circuit (IC) applications in which differential signals are commonly employed. Still further, AGC amplifiers with peak detection require a large capacitor to hold the peak value of the detected signal. Typically, such a capacitor is too large to be integrated into solid state form, and therefore, it must be provided as a discrete component increasing the size and manufacturing costs of the amplitude limiting circuitry.

SUMMARY OF THE INVENTION

The present invention overcomes these problems in the prior art. Therefore, it is an object of the present invention to provide an amplitude leveling circuit and method which does not introduce distortion into the leveled signal.

It is an object of the present invention to provide an amplitude leveling circuit which does not require large, discrete components, such as large peak detector capacitors, and which is suitable for solid state integration.

It is an object of the present invention to provide an amplitude leveling circuit that detects peak-to-peak or mean squared levels of input signals for accurate amplitude leveling of non-symmetrical signals.

It is a further object of the present invention to provide an amplitude leveling circuit that operates effectively on differential signals.

The above-identified objects are met using an amplitude control circuit having a variable gain, linear amplifier which receives an input signal and generates an output signal corresponding to the input signal. A signal processor receives the output signal and determines a corresponding mean squared signal. An analyzer compares the mean squared signal with a reference and generates a feedback control signal that controls the gain of the variable gain amplifier in accordance with the difference between the mean squared signal and the reference value. The gain of the variable gain amplifier is controlled so that the amplitude of the output signal is maintained at a desired amplitude level without distorting the originally input waveform shape. To this end, the signal processor includes a multiplier which squares the output signal, and an averager that averages the squared signal to generate the mean squared signal.

In one preferred application, the amplitude control circuit is formed on an integrated circuit. Advantageously, the variable gain amplifier receives a differential input signal and generates a differential output signal. The differential output signal is squared and averaged, and a differential operational amplifier compares the averaged signal with a reference. The resulting feedback signal controls the gain of the variable gain amplifier in accordance with the difference between the averaged signal and the reference value. In this way, the gain of the variable gain amplifier is controlled so that the amplitude of the differential output signal is maintained at a desired amplitude level while still preserving the waveform shape of the input signal.

In yet a more detailed, example embodiment, the amplitude control circuit includes a differential amplifier having a pair of differential signal input terminals connected to biasing terminals of a pair of transistors. A variable gain amplifier circuit receives differential signals produced by the differential amplifier and generates a differential output signal at a pair of differential signal output terminals. A multiplier circuit squares the differential output signal. A current mirror connected to a reference current and to an output of the multiplier circuit generates a gain control signal connected to the variable gain amplifier.

A pair of DC level shifter circuits connect the pair of differential output terminals to the multiplier in order to generate differential output signals at two different DC levels. The multiplier may be a Gilbert cell multiplier connected to a first current source, and a current source may be employed to generate the reference signal. The reference signal preferably has a predetermined relationship to the current generated by the first current source. In particular, the ratio of the currents generated by the first and second current sources is less than one. A capacitor is connected (among other things) to the multiplier circuit output to low pass filter/average the squared differential output signal.

These features, objects, and advantages of the present invention will be described in further detail below in conjunction with the drawings and preferred, example embodiments.

BRIEF DESCRIPTION OF THE DRAWINGS

The present invention is illustrated by way of example and not limitation in the accompanying figures where like reference numerals indicate like elements and in which:

FIG. 1 shows an amplitude control circuit in accordance with one example embodiment of the present invention;

FIG. 2 shows another example embodiment of the present invention;

FIG. 4 is another, more detailed embodiment of an amplitude control circuit in accordance with the present invention.

DETAILED DESCRIPTION OF THE DRAWINGS

Figure 3:
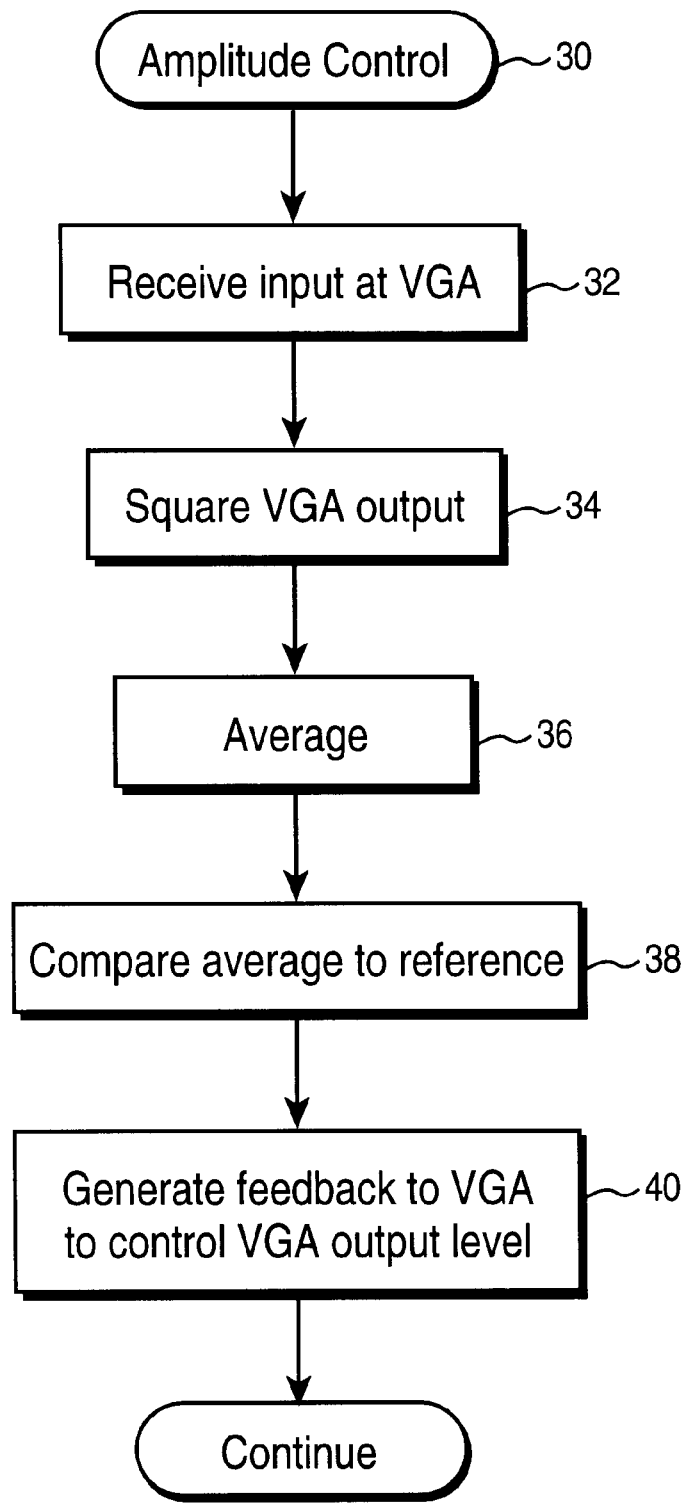
FIG. 3 is a flowchart diagram illustrating an example method in accordance with the present invention.

In the following description, for purposes of explanation and not limitation, specific details are set forth, such as particular embodiments, circuits, circuit components, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the present invention with unnecessary detail.

FIG. 1 illustrates a general example embodiment of an amplitude control circuit 10 in accordance with the present invention. An input signal is received at the input terminal of a linear variable gain amplifier (VGA) 12. The present invention has particularly advantageous application to analog input signals because the amplitude of the analog signal output from the linear variable gain amplifier 12 is limited to a desired level without distorting the waveform shape of the original input signal.

The variable gain amplifier output signal is processed in signal processor 14. In particular, the signal processor 14 determines a mean squared signal corresponding to the variable gain amplifier output signal. Squaring the signal permits accurate mean square detection of full waveforms, (rather than detection of only a positive or a negative peak), thereby providing accurate amplitude limiting for non-symmetrical signals. For purposes of this application the term "mean" includes authentic mean and average. The signal processor 14 may also determine a root mean squared (RMS) signal corresponding to the input if desired.

An analyzer 16 receives the mean squared output from signal processor 14 and compares it with a reference value. The output of analyzer 16 is fed back as a gain control signal to the linear, variable gain amplifier 12. The feedback control signal corresponds to a difference between the mean squared signal and the reference value and may be implemented as an integrating amplifier. The feedback control signal limits the output of the variable gain control amplifier 12 but without introducing distortion to the original input signal waveform. Moreover, signal amplitude in both positive and negative directions of the input waveform is detected to ensure that the output signal generated by variable gain amplifier is limited in RMS magnitude to a predetermined, desired level.

As mentioned above, a significant advantage of the present invention is that it does not require large components and may be formed on an integrated circuit. This advantage applies even more to a second example embodiment of an amplitude control circuit 20 in accordance with the present invention illustrated in FIG. 2.

In this second example solid state linear amplitude leveling circuit embodiment, the signals being processed are differential signals. The ability of the present invention to accurately process differential signals is a significant advantage over traditional, peak detection-based AGC level control circuits which lack this ability. Because differential signals are typically used in integrated circuits, the present invention is particularly advantageous in controlling the amplitude level of integrated circuit signals.

A linear, variable gain amplifier (VGA) 22 applies a variable gain in accordance with a feedback control gain signal to the differential input signal applied to positive (+) and negative (−) input terminals and generates a corresponding differential output signal on positive and negative output terminals having a limited amplitude but without distorting the original waveform of the differential input signal. The differential output is processed by a mean squared calculator 24 which squares the differential output signal and then determines its average. A differential operational amplifier 26 compares the average signal generated by mean squared calculator 24 with a reference signal to generate the feedback gain control signal for controlling the gain of the variable control amplifier 22.

In both of the first and second example embodiments, the squaring function may be implemented using a multiplier, and a mean or an averaging function may be implemented using a low pass filter. Such a low pass filter typically uses only a relatively small capacitor that can be readily integrated into an IC. In addition, while the reference value is typically constant when the desired amplitude level is to be constant, the reference signal may also be a modulated value when the desired amplitude level changes. The output would then be a variable mean squared output.

FIG. 3 illustrates a set of procedures, referenced as amplitude control (block 30), for implementing an example of a method in accordance with the present invention. The input signal is received at a linear, variable gain amplifier and amplified in accordance with the currently set gain which can be greater or less than one (block 32). The output of the variable gain amplifier is then squared (block 34) and averaged (block 36). The averaged output signal is compared with a reference (block 38) to generate a feedback control signal corresponding to a difference between the average signal and the reference. The gain of the variable gain amplifier is controlled with the feedback control signal to ensure that the amplitude of the variable gain amplifier output signal is maintained at a desired amplitude level (block 40). As mentioned above, the amplitude of the output signal is maintained at the desired amplitude level without distorting the input signal. Moreover, the variable gain amplifier input and output signals may be differential signals.

Yet another example embodiment of the present invention is described in conjunction with the amplitude control circuit 50 illustrated in FIG. 4. The amplitude control circuit 50 includes a variable gain amplifier 52 connected to a pair of DC level shifters 54 and 56 which in turn are connected to a multiplier 58. The multiplier output is connected to an active load 60 which generates a gain control signal 62.

The variable gain amplifier includes six transistors $Q_1$–$Q_6$, resistors $R_1$–$R_4$, and power supplies $V_{cc}$ and $V_{bias}$. A differential input (I/P) signal is received at the positive and negative terminals (the left-hand side) of the variable gain amplifier 52. The positive terminal is connected to the base of transistor $Q_5$, and the negative terminal is connected to the base of transistor $Q_6$. The amplifiers $Q_5$ and $Q_6$ form a differential pair, and resistors $R_1$ and $R_2$ are emitter degeneration resistors which maintain a linear transconductance curve for transistors $Q_5$ and $Q_6$. As a result, the variable gain amplifier 52 is linear in operation.

Transistors $Q_1$–$Q_4$ perform a gain variation function. The collectors of transistors $Q_5$ and $Q_6$ are connected to the emitter coupled transistor pairs $Q_1$, $Q_2$, and $Q_3$, $Q_4$, respectively. A gain control signal 63 described in further detail below is connected to the base terminals of both transistors $Q_1$ and $Q_4$. The collectors of transistors $Q_1$–$Q_4$ are all connected to a standard DC voltage supplied at $V_{cc}$, and resistors $R_3$ and $R_4$ connected to the collectors of transistors $Q_1$ and $Q_3$ are load resistors. A biasing voltage $V_{bias}$ is derived, for example, from $V_{cc}$. In effect, DC voltage is applied to the bases of transistors $Q_2$ and $Q_3$, and a variable (slowly-varying) voltage in the form of gain control signal 62 is applied to the bases of the other transistors $Q_1$ and $Q_4$ in the transistor pairs. In effect, transistors $Q_1$–$Q_4$ split a portion of the current from transistors $Q_5$ and $Q_6$. The current through transistors $Q_1$ and $Q_4$ is shunted to $V_{cc}$. The remaining portion of signal current through transistors $Q_2$ and $Q_3$ flows through resistors $R_3$ and $R_4$ thereby producing a signal voltage taken as the differential output signal.

The differential output signal terminals are also connected to two DC level shifters 54 and 56. These DC level shifters provide a fixed DC level shift, and at the same time, preserve AC waveform components of the output signal. The DC level shifters 54 and 56 are employed because transistors $Q_7$ through $Q_{10}$ require a first DC bias, and the transistors $Q_{11}$ and $Q_{12}$ require a second, lower DC bias. The output of the variable gain amplifier 52 is applied to both of these sets of transistors which is why each DC level shifter includes one input and two outputs.

One example way of implementing a DC level shifter is to use a series connected transistor resistor current source arrangement. Specifically, the bases of transistors $Q_{16}$ and $Q_{17}$ are connected to the output signal terminals at resistors $R_3$ and $R_4$. The emitter terminals of transistors $Q_{16}$ and $Q_{17}$ are used to drive the bases of transistors $Q_7$–$Q_{10}$. After a voltage drop across respective emitter-connected resistors $R_5$ and $R_6$, a second lower voltage output signals from each of the DC level shifters 54 and 56 is connected to drive the base terminals of transistors $Q_{12}$ and $Q_{11}$, respectively, The multiplier 58 is implemented as a well-known, Gilbert cell multiplier which includes transistors $Q_7$–$Q_{12}$ and resistors $R_7$ and $R_8$. Since Gilbert cell multipliers are conventional and well-known, no further description of the operation of the multiplier circuit 58 is believed necessary.

The outputs of the Gilbert cell multiplier 58 at collectors of transistors $Q_8$ and $Q_{10}$ are summed at node 62 in an active load 60. The active load 60 is a current mirror which includes transistors $Q_{13}$ and $Q_{14}$ connected at their base terminals. The current source $I_2$ provides a reference current corresponding, for example, to the reference value shown as an input to differential operational amplifier 26 in FIG. 2. Preferably, current $I_2$ is related to the current produced by current source $I_1$ connected to the Gilbert multiplier 58 as shown in FIG. 4. The reference current $I_2$ generates the current flowing through the transistor $Q_{14}$. Since the transistors $Q_{13}$ and $Q_{14}$ are connected as a current mirror, the transistor $Q_{13}$ attempts to reproduce that reference current $I_2$ into the node 62.

In effect, the active load is comprised of both transistors $Q_{13}$ and $Q_{14}$. As a result, if the output current of transistors $Q_8$ and $Q_{10}$ is greater than the reference current in current source $I_2$, then the voltage at node 62 decreases. If the output current of transistors $Q_8$ and $Q_{10}$ is less than the reference current generated by current source $I_2$, then the voltage at node 62 increases.

Also connected to node 62 is a capacitor $C_1$ connected to the common base of transistors $Q_{13}$ and $Q_{14}$. The capacitor $C_1$ performs two functions: filtering the squared voltage present at node 62 and stabilizing the feedback loop function, i.e., the gain loop control signal 63. The filtering action of capacitor $C_1$ performs a time averaging of the squared signal. More specifically, higher frequency components of the voltage present at node 62 are attenuated by the capacitor so that the signal on the collector of transistor $Q_{13}$ is greatly attenuated for high frequencies. Assuming for example that the output signal of the variable gain amplifier 52 is a sine wave, the squaring function implemented in multiplier 58 produces a DC level desired value for comparison to the reference signal. However, the squaring function also produces signal components at twice the frequency of the input signal and harmonics thereof. These higher frequency components are undesirable and are filtered out by the capacitor $C_1$. As mentioned above, the size of capacitor $C_1$ is relatively small and therefore may be implemented in solid state form on an integrated circuit.

Because node 62 is a high impedance node and should not be loaded to other signal inputs without having a detrimental effect, an emitter-follower buffer, implemented as transistor $Q_{15}$, presents a high impedance to the collector of transistor $Q_{13}$. As a result of that high impedance, the signal level at the collector of transistor $Q_{13}$ is not attenuated, and the current balance between transistors $Q_8$, $Q_{10}$, and $Q_{13}$ is preserved. Current source $I_4$ provides a biasing current for transistor $Q_{15}$ to keep that transistor active. The buffered signal from transistor $Q_{15}$ corresponding to gain control signal 63 controls the base voltage of transistors $Q_1$ and $Q_4$ which in turn modulates the gain of the variable gain amplifier 52.

Current source $I_3$ provides a bias current to ensure that transistors $Q_1$–$Q_6$ are all in an active state. Current source $I_1$ similarly provides a biasing current for the transistors in the multiplier circuit 58. In addition, current source $I_1$ maintains the relationship between currents $I_1$ and $I_2$ because the multiplier circuit output currents from transistors $Q_8$ and $Q_{10}$ is proportional to the bias current $I_1$. As a result, once the feedback loop achieves steady state, the collector currents of transistors $Q_8$ and $Q_{10}$ are in a predetermined ratio of the current $I_1$. Therefore, $I_2$ is set to be a fraction of the current $I_1$. In general, the ratio of $I_2$ to $I_1$ will be between 0 and 1.

As described above, the present invention provides an amplitude control/leveling circuit and methodology that permits accurate leveling of asymmetric and differential signals using circuitry that can be readily implemented on an integrated circuit chip. Equivalent analog and digital circuitry may be employed to implement the functions described in conjunction with the above illustrative embodiments. The linear amplitude leveling control in accordance with the present invention does not introduce distortion and is suitable for solid state integration may be employed in any number of amplitude control environments, e.g., to level local oscillator signals used to drive a mixer, remove AC ripple, compensate for temperature variations, generate or detect AM modulation components, prevent amplifier overdrive, etc.

The invention has been described in terms of specific embodiments to facilitate understanding. The above embodiments, however, are illustrative rather than limitive. It will be apparent to one of ordinary skill in the art that departures may be made from the specific embodiments shown above without departing from the essential spirit and scope of the invention. Therefore, the invention should not be regarded as being limited to the above examples, but should be regarded instead as being fully commensurate in scope with the following claims.

What is claimed is:

1. An amplitude control circuit for controlling the amplitude of an input signal, comprising:

differential circuitry having a pair of differential signal input terminals connected to biasing terminals of a pair of connected transistors for receiving the input signal and producing differential signals;

a variable gain, linear amplifier amplifying the differential signals produced by the differential circuitry and generating a differential output signal at a desired amplitude level without distorting a shape of the input signal;

a multiplier circuit squaring the differential output signal to generate a mean square signal corresponding to a mean square of the differential output signal; and a current mirror, coupled to an external reference source, using the mean square signal from the multiplier circuit to generate a gain control signal for controlling the gain of the variable gain, linear amplifier.

2. The amplitude control circuit in claim 1, further comprising:

a DC level shifter circuit connecting the differential output signal to the multiplier for generating the differential output signals at two different DC levels.

3. The amplitude control circuit in claim 1, wherein the multiplier is a Gilbert cell multiplier connected to a first current source.

4. The amplitude control circuit in claim 3, wherein the external reference source is related to the current generated by the first current source.

5. The amplitude control circuit in claim 4 wherein the ratio of the currents generated by the second current source and the first current source is less than 1.

6. The amplitude control circuit in claim 1, further comprising:

a buffer amplifier connected between the current mirror output and the variable gain amplifier circuit.

7. The amplitude control circuit in claim 1, further comprising:

a capacitor connected to the multiplier circuit, the current mirror, and the variable gain amplifier.

* * * * *